United States Patent [19]

Wolf et al.

[11] 3,852,802

[45] Dec. 3, 1974

[54] INTEGRATED CIRCUIT HALL EFFECT DEVICE AND METHOD

[75] Inventors: Helmut F. Wolf, San Mateo; David Kleitman, Los Altos Hill, both of Calif.

[73] Assignee: Signetics Corporation, Sunnyvale, Calif.

[22] Filed: Oct. 10, 1973

[21] Appl. No.: 405,066

Related U.S. Application Data

[63] Continuation of Ser. No. 249,248, May 1, 1972, abandoned.

[52] U.S. Cl. .................. 357/27, 307/303, 307/309, 357/49

[51] Int. Cl. ........................................ H01l 19/00

[58] Field of Search .................. 307/309; 338/32 H; 317/235 H, 235 E, 235 F

[56] References Cited

UNITED STATES PATENTS

| | | | |
|---|---|---|---|
| 3,305,790 | 2/1967 | Parsons et al. | 317/235 H |
| 3,404,321 | 10/1968 | Kurosawa et al. | 317/235 E |
| 3,522,494 | 8/1970 | Bosch | 317/235 H |
| 3,596,114 | 7/1971 | Maupin et al. | 317/235 H |

*Primary Examiner*—Rudolph V. Rolinec
*Assistant Examiner*—William D. Larkins
*Attorney, Agent, or Firm*—Flehr, Hohbach, Test, Albritton & Herbert

[57] ABSTRACT

An integrated circuit including a Hall effect semiconductor device and a method for making the device. A semiconductor body is carried by a support structure and insulating material forms a plurality of isolated islands in the semiconductor body. In accordance with one embodiment some isolated islands of the semiconductor body have a relatively thick epitaxial layer thereon with transistors or other circuit elements formed therein according to conventional techniques. At least one of the isolated islands has a relatively thin epitaxial layer thereon with a diffused region of conductivity type opposite that of the epitaxial layer formed in the epitaxial layer. The relatively thin epitaxial layer has means forming a pair of current terminals at opposite ends of one lateral dimension thereof and means forming a pair of Hall voltage terminals at opposite ends of the other lateral dimension thereof.

5 Claims, 8 Drawing Figures

INTEGRATED CIRCUIT HALL EFFECT DEVICE AND METHOD

This is a continuation, of application Ser. No. 249,248 filed May 1, 1972 now abandoned.

BACKGROUND OF THE INVENTION

This invention pertains to integrated circuits and more particularly pertains to integrated circuits which include a Hall effect device.

The Hall effect is the development of a transverse electric potential gradient or voltage in a current-carrying conductor when it is placed in a magnetic field such that the direction of the magnetic field is perpendicular to the direction of current flow. This Hall voltage $V_H$ is given by the equation $$V_H = R_H\ (I_z\ H_x / X_w) \quad (1)$$

where $I_z$ is the current in direction $Z$, $X_w$ is the thickness of the current-carrying conductor and $R_H$ is a proportionality factor known as the Hall coefficient. The Hall coefficient $R_H$ and hence the Hall voltage is inversely proportional to the density of free carriers in the current-carrying conductor. Hall effect devices are thus useful, for example, in determining the magnitude of a magnetic field provided that the carrier density is known.

In order to obtain a relatively high Hall voltage, a material must be utilized for the Hall effect device which has a relatively small carrier density. Since the carrier density in semiconductors is several orders of magnitude less than the density of lattice atoms, semiconductor Hall effect devices are capable of displaying a relatively large Hall voltage.

Another factor associated with semiconductor Hall effect devices is a property which is defined as the Hall mobility. The Hall mobility, which should not be confused with the normally quoted carrier mobility, is proportional to the Hall coefficient and semiconductor conductivity. Similar to the carrier mobility, the Hall mobility in a semiconductor film is significantly less than in bulk material. This is partially due to the influence of the semiconductor surface where mobility is reduced below that in the bulk. It is also due to dislocation scattering, neutral scattering, and the space charge around edge dislocations.

Prior art Hall effect devices have been discrete devices. Such discrete devices by virtue of the limitations of manufacturing techniques had to be relatively thick, say on the order of 50 to 100 microns or even thicker. Such relatively thick devices meant that the available Hall voltage developed was quite low so that it had to be amplified for most purposes. Further, since the materials used were so thick, the materials had to have a high carrier mobility in order to compensate for the voltage loss as a result of the thicker material. This meant such Hall effect devices had to be made from materials such as indium antimonide, for example. Such materials have had additional disadvantages. For instance, indium antimonide can only be used at relatively low temperatures.

OBJECTS AND SUMMARY OF THE INVENTION

Accordingly, it is an object of this invention to provide an improved semiconductor Hall effect device and method for making the same which is not subject to thte above-enumerated disadvantages.

It is another object of this invention to provide an integrated circuit incorporating a Hall effect device of small thickness.

It is another object of this invention to provide an integrated circuit and method for making the same which includes a Hall effect device of small thickness formed in bulk semiconductor material.

Briefly, in accordance with one embodiment of the invention a single crystal semiconductor body is carried by a support structure and isolation means is provided forming a plurality of isolated islands in the semiconductor body. A Hall effect device is formed in at least one of the isolated islands and includes a first region of given conductivity type and an adjacent second region of predetermined thickness and of opposite conductivity type. A third region of the given conductivity type is formed in the second region and extends therein to a predetermined thickness less than the predetermined thickness of the second region. Means are provided forming a pair of current terminal connections and a pair of Hall voltage terminal connections to the second region.

DESCRIPTION OF THE PREFERRED EMBODIMENTS

Figure 1A:
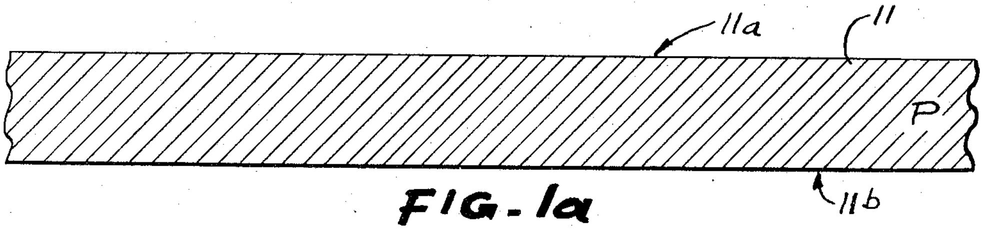
FIGS. 1*a* through 1*e* are cross sectional views of various steps of constructing an integrated circuit in accordance eith this invention with FIG. 1e showing a cross sectional view of a Hall effect device and a transistor.
Figure 1B:
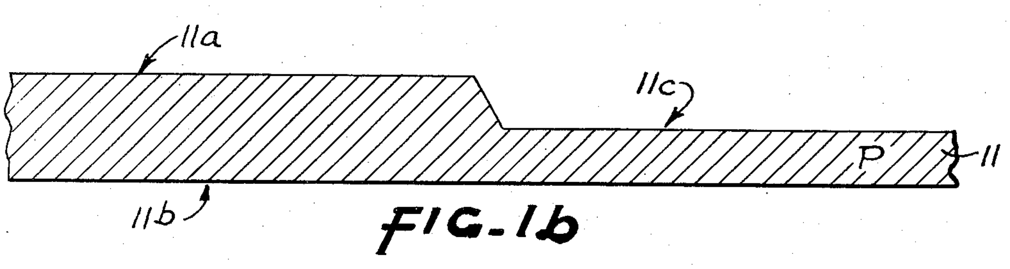

Turning now to a consideration of the drawings, the series of FIGS. 1*a* through 1*e* illustrate various steps and structures of the present invention. FIG. 1*a* shows a body of semiconductor material 11 which can be single crystal silicon for example. The body of semiconductor material 11 is doped throughout with an impurity and may be, for example, P-type semiconductor material having an upper surface 11a and a lower surface 11b. In accordance with the invention, a portion of the semiconductor body 11 is selectively etched to form a structure such as shown in FIG. 1*b* resulting in a stepped upper surface for the semiconductor or body 11 with a new top surface portion 11*b* spaced some distance beneath the level of the top surface 11*a*. As an example of typical dimensions the selective etching is carried out for a sufficient length of time such that the surface 11*c* is spaced 10 microns below the surface 11*a*. The etching can be carried out using a suitable photolithographic mask and etching solution in a manner well known to those skilled in the art.

Figure 1C:
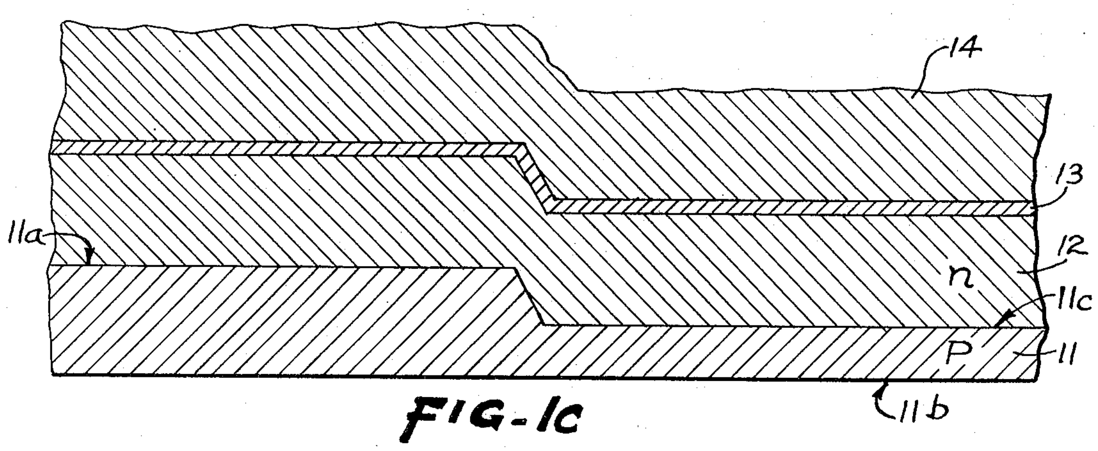

Referring now to FIG. 1*c*, after the selective etching of the semiconductor body 11, an epitaxial layer 12 is grown on the stepped semiconductor body top surface. This epitaxial layer 12 may be grown to a thickness of 15 microns, for example, and may comprise N-type conductivity silicon. Deposition of the epitaxial layer 12 is followed by deposition of a relatively thick insulating layer 13, which may be silicon dioxide for example, followed by deposition of a polycrystalline semiconductor layer 14. One of the reasons for requiring an insulating layer 13 is to prevent outdiffusion of impurities from the epitaxial layer 12 into the polycrystalline layer 14 during the high temperature deposition of this layer 14.

Figure 1D:
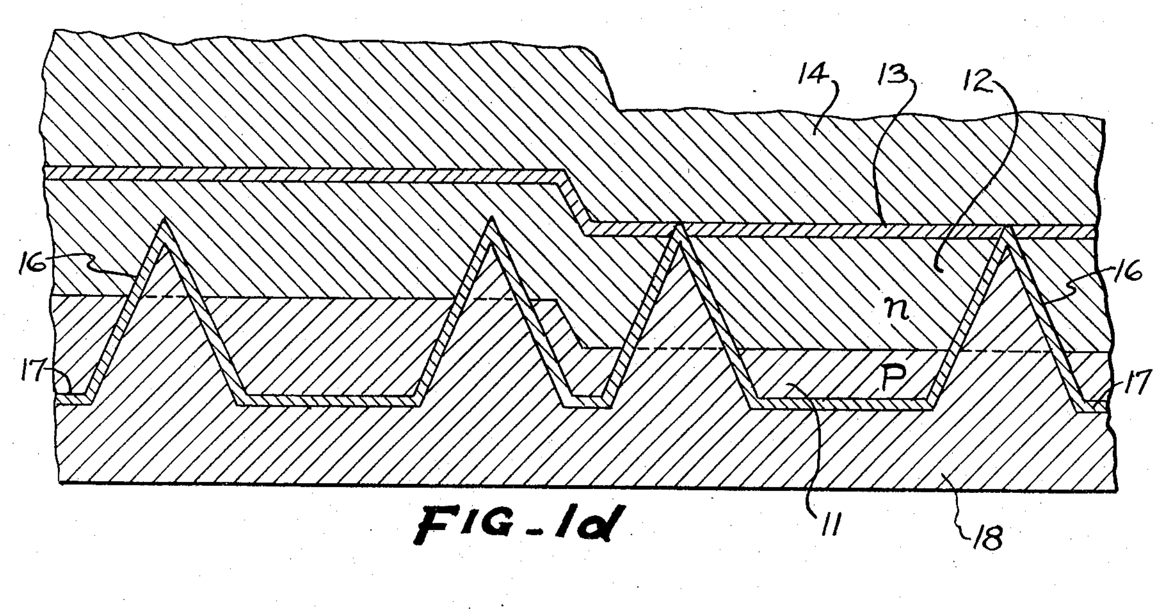

Next, as illustrated in FIG. 1*d* and in accordance with techniques known in the art, anisotropic etching and dielectric isolation are accomplished from the bottom surface 11*b* of the semiconductor body 11. For example, as known to those skilled in the art, anisotropic etching etches semiconductor material at preferential rates along certain crystal planes to result in the V-shaped troughs 16. A layer of insulating material 17, such as silicon dioxide, for example, is then deposited over the bottom surface 11*b* of the semiconductor body 11 and extending into the troughs 16. After deposition of this insulating layer 17 a support body of material 18 which may be polycrystalline silicon for example, is grown on top of the insulating layer 17 and extending into the trough 16. The anisotropic etching and dielectric isolation scheme described above is merely one embodiment of a method in accordance with this invention and is not essential. P-N junction isolation, other methods and structures of dielectric isolation, or other techniques known to those skilled in the integrated circuit art for separating devices in an integrated circuit may be utilized in conjunction with this invention.

Figure 1E:
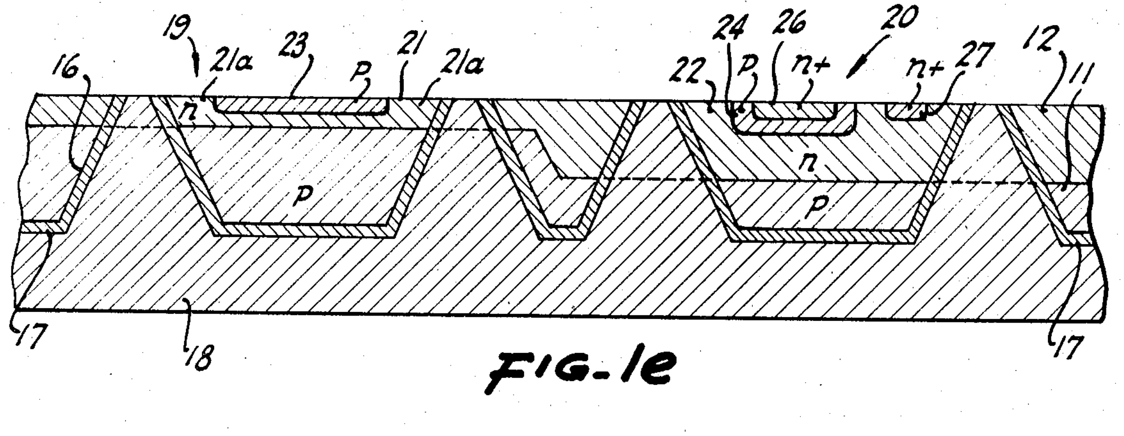

The next step is removal of material from the structure shown in FIG. 1*d* from the top side thereof. That is, the polycrystalline structure 14, the insulating layer 13 and a portion of the epitaxial layer is removed, such as by lapping for example. All of the polycrystalline semiconductor material 14 and the insulating layer 13 is removed and the epitaxial layer 12 is lapped to the point where it has a thickness on the order of 2 microns, for example, at its thinnest part. Since the selective etching of the semiconductor body 12 etches the portion of the semiconductor body 12 down about 10 microns, then the thickness of the epitaxial layer at its thicker portion is approximately 12 microns. This lapping or removal of material in this particular embodiment also extends past the bottom portions of the troughs 16 so that the semiconductor body 11 with the epitaxial layer 12 thereon is separated into a plurality of isolated islands (two of which 19 and 20 are shown in FIG. 1e). These islands are isolated from each other and from the support body 18 by the layer of insulating material 17.

FIG. 1e illustrates formation of a Hall effect device in the isolated island 19 and formation of other circuitry, a transistor for example, in the isolated island 20. As mentioned above, it will be appreciated that the lapping step has left an epitaxial layer 21 in the isolated island 19 having a thickness on the order of two microns and an epitaxial layer 22 in the isolated island 20 having a thickness on the order of 12 microns. Next, a selective P-type diffusion, for example, is made into the thin epitaxial layer 21 in isolated island 19 to form a P-region 23. This leaves a very narrow buried N-type region in the thin epitaxial layer 21 which, together with the N-type regions 21*a* extending to the top surface, form a Hall effect device. The device should be laterally as short as possible in order to have a low resistance and allow operation at a high current level at a given supply voltage.

The selective P-type diffusion for forming the region 23, can also be utilized, if necessary, to form a transistor base 24 in the thick epitaxial layer 22. This can be followed by N-type diffusions to form the transistor emitter 26 along with the contact region 27 to the thick collector region formed by the thick epitaxial layer 22.

After completion of all these operations a structure results having a cross section such as shown in FIG. 1*e*. The advantages of the technique described above are that a Hall effect device can be formed in an integrated circuit with other circuitry, transistors for example, and the Hall effect device will have a very narrow width (less than 2 microns for example) whereas at the same time a thick epitaxial layer is available as is required by other circuitry for forming a transistor collector for example. Further, the Hall effect device, by reason of the P-region 23, is formed in bulk semiconductor material which, as previously discussed, leads to a higher Hall mobility and consequently higher Hall voltage than if the Hall effect device extends to the surface of semiconductor material. The construction shown in FIG. 1*e* leads to relatively high Hall voltages so that little, if any, amplification is required ot these voltages in order to have useful Hall voltage magnitudes.

Figure 2:
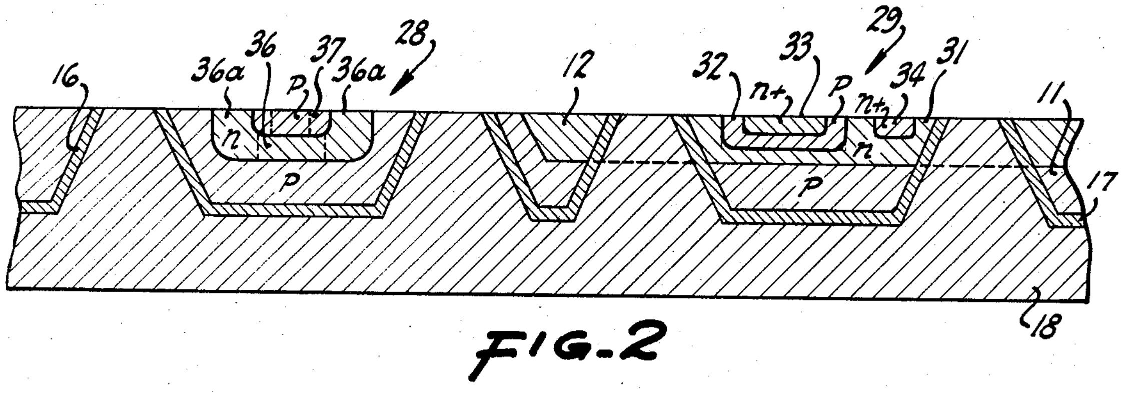
FIG. 2 is a cross sectional view of another embodiment of the invention in which a Hall effect device is formed in the semiconductor body and a transistor is formed in an epitaxial layer extending over part of the semiconductor body.

Turning now to FIG. 2, there is shown an alternate construction of an integrated circuit in accordance with this invention. The structure of FIG. 2 is formed in much the same way as the structure of FIG. 1*e*. That is, the structure of FIG. 2 is formed in the same manner and proceeds to the same steps through the structure of FIG. 1*d*. Lapping or removal of material is then carried out but the lapping or removal of material is allowed to proceed until all of the epitaxial layer 12 overlying the region of the semiconductor body 11 where the Hall effect device is to be formed is removed. Thus there results an isolated island 28 which has no epitaxial layer and an isolated island 29 which has an epitaxial layer 31 having a thickness on the order of 10 microns. In accordance with the invention, a Hall effect device is formed in the isolated island 28 and a transistor is formed in the isolated island 29. The transistor is formed by a P-diffusion to form a base region 32 followed by N-type diffusion to form an emitter region 33 along with a contact region 34 for the collector region comprising the epitaxial layer 31. In the structure shown in FIG. 2 the Hall effect device is formed in the isolated island 23 by two diffusions instead of one. The first diffusion is an N-type diffusion, for example, which forms an N-type region 36 which may extend downwardly for a depth on the order of 2 microns for example. Then a selective P-type diffusion is made to form a P-region 37 which extends downwardly some distance less than 2 microns. The difference between the bottom of the region 37 and the bottom of the region 36 is thus the width of the Hall effect device. Portions of the N-type region 36*a* extend upwardly to the surface for forming terminal means for making connection to the Hall effect device. Thus a structure as shown in FIG. 2 is an integrated circuit including a Hall effect device in one isolated island thereof which is of very narrow width and is formed in bulk semiconductor material. Further, other circuitry is formed in the integrated circuit which may include, for example, a transistor with there being provided a relatively thick epitaxial layer in the region where the transistor is formed to serve as a collector region and having sufficient thickness to permit adequate base and emitter diffusions for forming the transistor.

Figure 3:
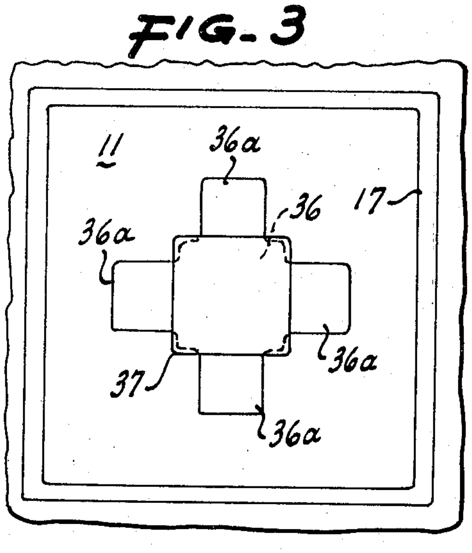
FIG. 3 is a top plan view of the Hall effect device of either FIG. 1e or FIG. 2 showing where electrical connections are made to the Hall effect device.

FIG. 3 is a top plan view of the Hall effect device formed in the isolated island 28 and shows the manner in which the portions 36*a* of the N-type region 36 extend to the surface forming terminals for allowing connection to the Hall effect device. A pair of the portions 36*a* at opposite ends of one lateral dimension of the N-region 36 form a pair of current terminals and another pair of regions 36*a* at opposite ends of the other lateral dimension of the N-type region 36 form a pair of Hall effect voltage terminal means. As shown in FIG. 3, preferably the P-type region 37 extends beyond the boundaries of the N-type region 36 at all portions thereof except the portions 36*a* which extends to the surface. This prevents unwanted surface currents in the N-type material 36 which would lead to drastic reductions in the available Hall effect voltage developed.

Figure 4:
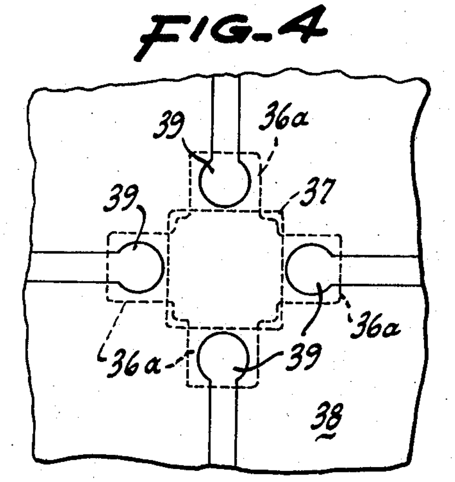
FIG. 4 is a top plan view similar to FIG. 3 but showing the Hall effect device with an insulating layer thereon and illustrating placement of metallization for connecting the current and Hall voltage terminals.

FIg. 4 is a top plan view similar to FIG. 3 but showing the structure of FIG. 3 after a layer of insulating material 38, which may be silicon dioxide for example, has been deposited over the entire surface of the structure shown in FIG. 3. Then according to techniques well known in the art windows are opened up in the silicon dioxide for making contact to the areas 36*a* of the N-type material 36 with appropriate metallization 39 then being deposited for making external electrical contact to the terminal means 36*a*.

Thus what has been described in an integrated circuit having a plurality of semiconductor islands in which a Hall effect device is formed in at least one of the islands and other circuitry which may be a transistor for example is formed in at least one other of the islands. In accordance with one specific embodiment of the invention, the semiconductor islands are isolated from each other by dielectric isolation. In accordance with the invention, a Hall effect device is formed which has a very narrow width, which leads to high Hall voltages. Further, the Hall effect device extends through bulk semiconductor material rather than at a semiconductor surface so that a high Hall mobility is achieved. While specific embodiments of the invention have been described, it will be obvious to those skilled in the art that various modifications and alternations may be made to the structures and methods disclosed herein without departing from the true spirit and scope of the invention. Thus, for example, instead of utilizing dielectrically isolated islands, the Hall effect device and transistor or other circuitry may be formed in regions of a semiconductor body which are isolated by P-N junction isolation or which are merely separated from each other by sufficient spacing in the semiconductor body to assure isolation.

We claim:

1. An integrated circuit comprising: a single crystal semiconductor body of one conductivity type, a layer of semiconductive material of the opposite conductivity type carried on one face of said semiconductor body said layer having a planar outer surface and a stepped inner boundary contiguous to said semiconductor body to provide both a relatively thick layer and a relatively thin layer; means for electrically isolating at least a portion of said thin layer from at least a portion of said thick layer; a Hall effect device formed in said thin layer portion; and a transistor formed in said thick layer portion.

2. A circuit as in claim 1 where said thin layer is 2 microns and said thick layer is 12 microns.

3. A circuit as in claim 1 where said Hall effect device includes a region inset into said thin layer portion of opposite conductivity type to said thin layer portion.

4. A circuit as in claim 3 where said transistor includes a first region inset into said thick layer portion of opposite conductivity type to such portion and a second region inset into said first region of the same conductivity type.

5. A circuit as in claim 1 where said layer carried on said semiconductor body is epitaxial.

* * * * *